US006353357B1

(12) United States Patent
Kaiser et al.

(10) Patent No.: US 6,353,357 B1
(45) Date of Patent: Mar. 5, 2002

(54) CONTROLLING TRANSISTOR THRESHOLD POTENTIALS USING SUBSTRATE POTENTIALS

(75) Inventors: Robert Kaiser, Kaufering; Helmut Schneider, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/693,769

(22) Filed: Oct. 20, 2000

(30) Foreign Application Priority Data

Oct. 20, 1999 (DE) .......................... 199 50 543

(51) Int. Cl.[7] .............. G05F 1/46; H01L 27/04
(52) U.S. Cl. .......................... 327/537; 327/546; 326/34
(58) Field of Search .................... 327/534, 535, 327/537, 546, 215; 326/27, 31, 34; 365/189.09

(56) References Cited

U.S. PATENT DOCUMENTS 5,397,934 A * 3/1995 Merrill et al. ............... 327/535
5,874,851 A * 2/1999 Shiota ........................ 327/534
6,046,627 A * 4/2000 Itoh et al. ................... 327/534
6,194,915 B1 * 2/2001 Nakayama et al. ......... 327/534

FOREIGN PATENT DOCUMENTS

DE    197 27 817 A1    1/1998    ........... H01L/23/58

* cited by examiner

*Primary Examiner*—Timothy P. Callahan
*Assistant Examiner*—Terry L. Englund
(74) *Attorney, Agent, or Firm*—Herbert L. Lerner; Laurence A. Greenberg; Werner H. Stemer

(57) ABSTRACT

An integrated circuit has a first control unit for controlling the threshold potential of the transistors of a first conductivity type. In addition, it has a second control unit for controlling the threshold potentials of the transistors of a second conductivity type. The required value input of the second control unit is supplied with a required value for the threshold potential of the transistors of the second conductivity type, which is proportional to the actual value of the threshold potential of the transistors of the first conductivity type. Due to the dependence of the second control unit on the control by the first control unit, improved switching characteristics of the integrated circuit are achieved.

3 Claims, 2 Drawing Sheets

CONTROLLING TRANSISTOR THRESHOLD POTENTIALS USING SUBSTRATE POTENTIALS

BACKGROUND OF THE INVENTION

Field of the Invention

The invention concerns an integrated circuit that has control units for controlling the threshold potentials of its transistors.

A circuit of this kind is described in U.S. Pat. No. 5,874,851. Because of fluctuations in the process of manufacturing integrated circuits, the transistors of the integrated circuit are subject to parameter fluctuations. According to U.S. Pat. No. 5,874,851, the threshold potentials of the field effect transistors must be controlled in order to compensate for the fluctuations. In this way it is possible to compensate both the process fluctuations arising during manufacture and also the temperature effects occurring during operation of the circuit. In the solutions described in U.S. Pat. No. 5,874,851, control of the potential of the n-well is exercised independently of control of the potential of the p-well.

Since most subcircuits of an integrated circuit include both n-channel transistors and p-channel transistors, the function of such a subcircuit is dependent on the threshold potentials of both types of transistor. Because every control has a specific transient response, it can occur with the independent control of the threshold potentials of the two transistor types as described in U.S. Pat. No. 5,874,851, that the transient response of the two controls or their response to interferences can have different chronological characteristics. However, this exerts influences on the functioning of the subcircuit.

SUMMARY OF THE INVENTION

It is accordingly an object of the invention to provide an integrated circuit with control of the threshold potentials of its transistors that overcomes the above-mentioned disadvantages of the prior art devices of this general type.

With the foregoing and other objects in view there is provided, in accordance with the invention, an integrated circuit containing first transistors of a first conductivity type having a first threshold potential and substrate terminals for receiving a first substrate potential. Second transistors of a second conductivity type having a second threshold potential and substrate terminals for receiving a second substrate potential are also provided. A first control unit is connected to the first transistors for controlling the first threshold potential. The first control unit has a first input for a required value of the first threshold potential, a second input for an actual value of the first threshold potential, and an output connected to the substrate terminals of the first transistors. A second control unit is connected to the second transistors for controlling the second threshold potential. The second control unit has a first input receiving a required value of the second threshold potential, a second input receiving an actual value of the second threshold potential, and an output connected to the substrate terminals of the second transistors. The required value of the second threshold potential is proportional to the actual value of the first threshold potential of the first transistors.

In the integrated circuit according to the invention a first control unit serves for controlling the threshold potential of the transistors of the first conductivity type and a second control unit serves for controlling the threshold potentials of transistors of the second conductivity type. The second control unit is supplied with a required value for the threshold potential of the transistors of the second conductivity type, which is proportional to the contribution to the required value of the threshold potential of the transistors of the first conductivity type. Thus the control of the threshold potential of the transistors of the second conductivity type is a control which is dependent on the control through the first control unit. In this way it is achieved that the threshold potential of the transistors of the second conductivity type is modified in dependence of the threshold potential of the transistors of the first conductivity type. This in turn achieves alignment of the chronological behavior of the two control units. Since the relationship of the threshold potentials of the transistors of different conductivity types influences the switching characteristics of subcircuits containing transistors of both conductivity types (both the digital switching characteristics and the analog amplification in the case of subcircuits which perform an amplifying function), it is achieved through the invention that these switching characteristics are independent of fluctuations in process parameters during the manufacture of the integrated circuit or of disturbances arising during their operation.

The switching characteristics of a subcircuit are essentially dependent on the saturation currents flowing in the transistors it contains. These currents depend on the threshold potential of the transistors. The switching speed and the working symmetry of such kinds of subcircuit are especially dependent on the relationship of the threshold potentials of the different types of transistor. As a result of the invention, both the switching speed and also the working symmetry (i.e. the switching characteristics) of the integrated circuit become independent of interfering influences.

The integrated circuit can, for example, contain a differential amplifier that includes transistors of both conductivity types. The relationship of the threshold potentials of the transistors is especially relevant for the way in which differential amplifiers function.

In accordance with an added feature of the invention, a first supply terminal and a second supply terminal are provided. The second control unit has a third transistor of the first conductivity type with a controllable path, a first terminal, a second terminal and a gate terminal. The gate terminal of the third transistor is connected to the second terminal of the third transistor. The second control unit has a fourth transistor of the second conductivity type with a controllable path, a gate terminal, a first terminal, and a second terminal. The controllable path of the third transistor and the controllable path of the fourth transistor are disposed in a series circuit between the first supply terminal and the second supply terminal. The gate terminal of the fourth transistor is connected to the second terminal of the fourth transistor. A comparison unit is provided and has a first input connected to a circuit node between the controllable path of the third transistor and the controllable path of the fourth transistor and a second input receiving a comparison value. The comparison unit has an output and generates an output signal. A generator is connected to the output of the comparison unit and outputs the second substrate potential for the second transistors. The generator generates the second substrate potential in dependence on the output signal from the comparison unit.

With the foregoing and other objects in view there is further provided, in accordance with the invention, an integrated circuit containing a first supply terminal, a second supply terminal, and a differential amplifier. The differential amplifier includes a first transistor of a first conductivity type and has a controllable path, a gate terminal, a substrate terminal for receiving a first substrate potential, and a first threshold potential; a second transistor of the first conductivity and has a controllable path, a gate terminal, a substrate terminal for receiving the first substrate potential, and the first threshold potential; and a third transistor of a second conductivity type and has a controllable path, a gate terminal, a substrate terminal for receiving a second substrate potential, and a second threshold potential. The controllable path of the first transistor and the controllable path of the third transistor are disposed in series between the first supply terminal and the second supply terminal. A fourth transistor of the second conductivity type is provided and has a controllable path, a gate terminal, a substrate terminal for receiving the second substrate potential, and the second threshold potential. The controllable path of the second transistor and the controllable path of the fourth transistor are disposed in series between the first supply terminal and the second supply terminal. A first signal input terminal is connected to the gate terminal of the first transistor and to the gate terminal of the third transistor. The first signal input terminal is further connected to a circuit node between the second transistor and the fourth transistor. A second signal input terminal is connected to the gate terminal of the second transistor and to the gate terminal of the fourth transistor. The second signal input terminal is further connected to a circuit node between the first transistor and the third transistor. A first control unit for controlling the first threshold potential of the first transistor and the second transistor is provided. The first control unit has a first input for a required value of the first threshold potential, a second input for an actual value of the first threshold potential, and an output connected to the substrate terminal of each of the first transistor and the second transistor. A second control unit for controlling the second threshold potential of the third transistor and the fourth transistor is provided. The second control unit has a first input receiving a required value of the second threshold potential, a second input receiving an actual value of the second threshold potential, and an output connected to the substrate terminal of each of the third transistor and the fourth transistor. The required value of the second threshold potential is proportional to the actual value of the first threshold potential.

Other features which are considered as characteristic for the invention are set forth in the appended claims.

Although the invention is illustrated and described herein as embodied in an integrated circuit with control of the threshold potentials of its transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
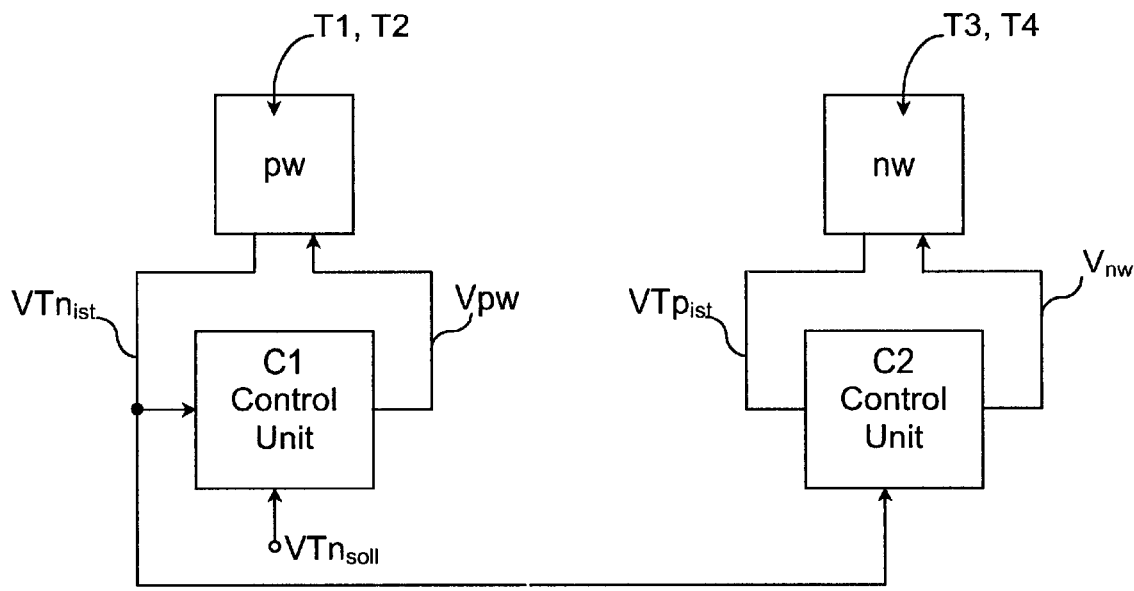
FIG. 1 is a block diagram of an integrated circuit according to the invention with two control units for controlling threshold potentials of transistors.

In all the figures of the drawing, sub-features and integral parts that correspond to one another bear the same reference symbol in each case. Referring now to the figures of the drawing in detail and first, particularly, to FIG. 1 thereof, there is shown an outline diagram of an integrated circuit according to the invention. The circuit has p-channel transistors T3, T4 in an n-well nw and n-channel transistors T1, T2 in a p-well pw. The circuit has a first control unit C1 for controlling a threshold potential of the n-channel transistors T1, T2. The control of a threshold potential of the p-channel transistors T3, T4 is effected through a second control unit C2. A required value $VTn_{soll}$ is supplied to the first control unit C1, which required value can also be modifiable in some exemplary embodiments of the invention. A threshold potential $VTn_{ist}$ of the n-channel transistors is supplied to the first control unit C1 as an actual value. Depending on the control deviation it determines between the required value and the actual value, the control unit C1 generates a control parameter being a substrate potential Vpw at its output for the p-well pw.

The threshold potential $VTp_{ist}$ of the p-channel transistors T3, T4, which are formed in the n-well nw, is supplied to the second control unit C2 as the actual value. As the required value for the threshold potential of the p-channel transistors, a value is supplied to the second control unit C2, which is proportional to the actual value $VTn_{ist}$ of the n-channel transistors. At its output, which is connected with the n-doped well nw, the second control unit C2 generates a substrate potential Vnw as a control parameter.

Figure 2:
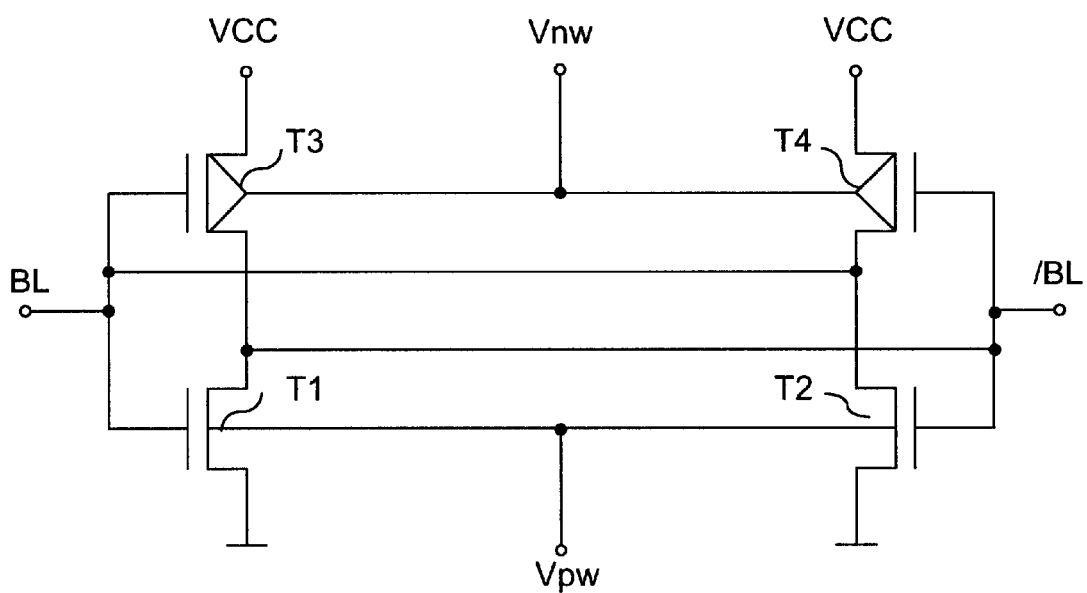
FIG. 2 is a circuit diagram of a differential amplifier, which is a component of the circuit illustrated in FIG. 1.

FIG. 2 shows an exemplary embodiment of a differential amplifier which has the n-channel transistors T1, T2, which are disposed in the p-well pw in FIG. 1, and the p-channel transistors T3, T4, which are disposed in the n-well nw in FIG. 1. The n-channel transistors contain a first transistor T1 and a second transistor T2. The p-channel transistors contain a third transistor T3 and a fourth transistor T4. Controllable paths of the third transistor T3 and the first transistor T1 are disposed in series between a positive supply potential VCC and ground. The controllable paths of the fourth transistor T4 and the second transistor T2 are also disposed in series between the positive supply potential VCC and ground. Gate terminals of the first transistor T1 and the third transistor T3 are connected with a first input BL and with drains of the second transistor T2 and fourth transistor T4. The gate terminals of the second transistor T2 and fourth transistor T4 are connected with a second input /BL and with drains of the first transistor T1 and third transistor T3.

The differential amplifier amplifies a differential signal between its two inputs (bit lines) BL, /BL. The substrate terminals of the p-channel transistors T3, T4 are in the n-well nw and are therefore connected with the substrate potential Vnw generated by the second control unit C2. The substrate terminals of the n-channel transistors T1, T2 are in the p-well pw and are therefore connected with the substrate potential Vpw, which is generated by the first control unit C1.

Because, as described above, the control of the threshold potential of the p-channel transistors T3, T4 is dependent on the threshold potential of the n-channel transistors T1, T2, defined switching characteristics are achieved for the differential amplifier. The switching characteristics are particularly independent of process fluctuations during the manufacture of the circuit. Therefore, a differential amplifier of this kind is also suitable for the amplification of very small differential signals. It can thus be used, for example, as a read amplifier in integrated memories including dynamic random access memories. In this case each of its two inputs BL, /BL is connected with one bit line of a bit line pair of the memory.

Before sources of the transistors T1 to T4 are connected in FIG. 2 with the supply potentials VCC, ground, one of the memory cells of the DRAM is read out so that a differential signal is set on the bit lines BL, /BL. Then, in order to amplify this, the supply potentials are connected with the transistors as illustrated in FIG. 2 (over circuit elements which are not shown). This results in an activation of the differential amplifier. As a result of the control according to the invention, this occurs in such a way that both the p-channel transistors T3, T4 and the n-channel transistors T1, T2 have the same switching characteristics. An even amplification of the differential signal therefore takes place, although all the transistors T1 to T4 are connected simultaneously with the supply potentials VCC, ground. In prior art read amplifiers for DRAMs, the read amplifier must be connected with the corresponding supply potential before the transistors of the other conductivity type are connected with the other supply potential, because of the asymmetrical switching characteristics of the different types of transistor in the read amplifier. Consequently, these read amplifiers of prior art function more slowly than the differential amplifier whose substrate potentials are controlled according to the invention.

Figure 3:
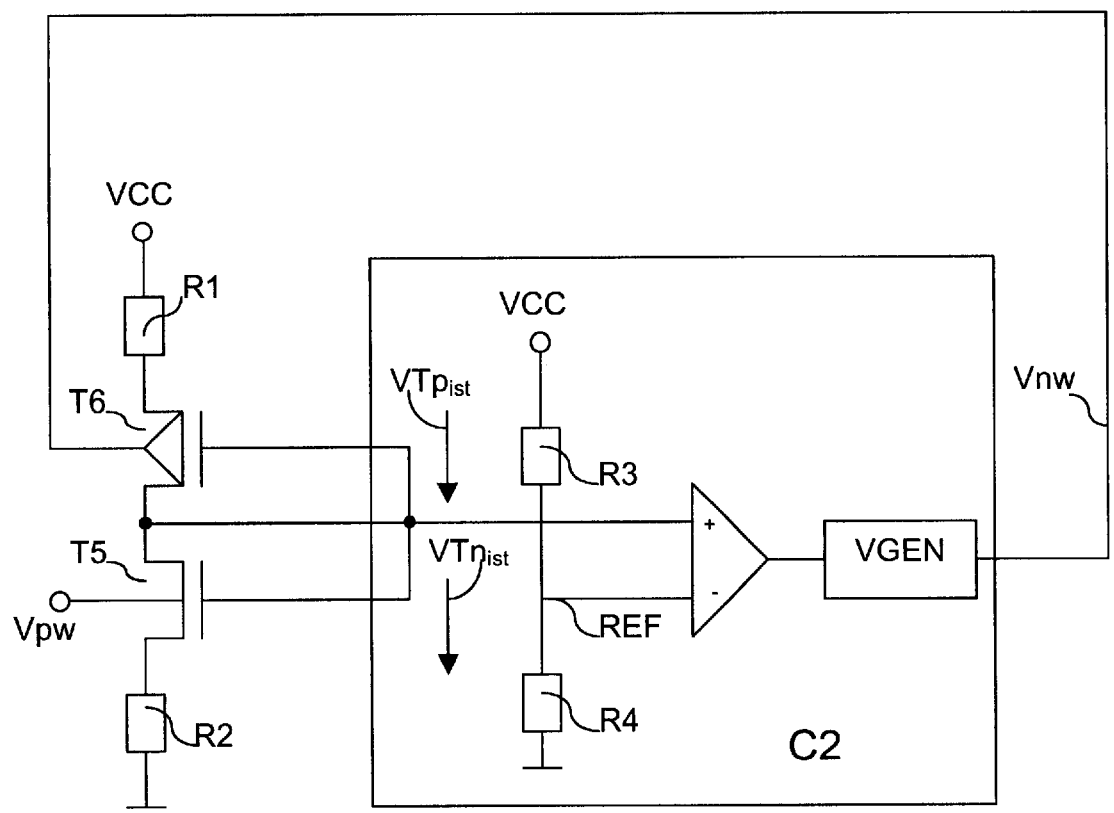
FIG. 3 is a circuit diagram of a second control unit from FIG. 1.

FIG. 3 shows an exemplary embodiment of the second control unit C2 from FIG. 1. The positive supply potential VCC is connected to ground over a first resistor R1, a sixth transistor T6 of p-channel type, a fifth transistor T5 of n-channel type and a second resistor R2. A gate and a drain of the transistors T5, T6 are connected respectively with each other. A substrate terminal of the n-channel transistor T5 is connected with the output of the first control unit C1 and a substrate terminal of the p-channel transistor T6 is connected with the output of the second control unit C2. The fifth transistor T5 and the sixth transistor T6 in FIG. 3 have exactly the same dimensions as the corresponding n-channel transistors T1, T2 and p-channel transistors T3, T4 respectively in FIG. 2.

In addition, the gate terminals of the transistors T5, T6 are connected with a first compare input of a comparator CMP. Also, a potential divider formed of two resistors R3, R4 is disposed between the positive supply potential VCC and ground. A central takeoff of the potential divider supplies a comparison value REF, which is connected with a second compare input of the comparator CMP. A potential generator VGEN produces the substrate potential Vnw for the n-well in dependence on the output signal of the comparator CMP.

The potential divider from the two transistors T5, T6 and the two resistors R1, R2 supplies a potential at the first compare input of the comparator which is dependent on the relationship of the threshold potentials $VTp_{ist}$, $VTn_{ist}$ of the transistors T5, T6. The required value for the second control unit C2 is thus dependent on the actual value $VTn_{ist}$ of the threshold potential of the n-channel transistors T1, T2, multiplied by a factor derived from the ratios R1/R2 and R3/R4 of the four resistors in FIG. 3. In the event R1=R2 and R3=R4 (i.e. REF=VDD/2), this required value for the p-channel transistors T1, T2 is equal to the actual value $VTn_{ist}$ of the n-channel transistors T1, T2. The proportionality factor between the required value and the actual value is then equal to 1. If the resistance relationships deviate from this, the required value has a different proportionality factor to the actual value $VTn_{ist}$.

We claim:

1. An integrated circuit, comprising:
   first transistors of a first conductivity type having a first threshold potential and substrate terminals for receiving a first substrate potential;
   second transistors of a second conductivity type having a second threshold potential and substrate terminals for receiving a second substrate potential;
   a first control unit connected to said first transistors for controlling the first threshold potential, said first control unit having a first input for a required value of the first threshold potential, a second input for an actual value of the first threshold potential, and an output connected to said substrate terminals of said first transistors; and
   a second control unit connected to said second transistors for controlling the second threshold potential, said second control unit having a first input receiving a required value of the second threshold potential, a second input receiving an actual value of the second threshold potential, and an output connected to said substrate terminals of said second transistors, and the required value of the second threshold potential is proportional to the actual value of the first threshold potential of said first transistors.

2. The integrated circuit according to claim 1,
   including a first supply terminal;
   including a second supply terminal;
   wherein said second control unit has a third transistor of said first conductivity type with a controllable path, a first terminal, a second terminal and a gate terminal, said gate terminal of said third transistor connected to said second terminal of said third transistor;
   wherein said second control unit also has a fourth transistor of said second conductivity type with a controllable path, a gate terminal, a first terminal, and a second terminal, said controllable path of said third transistor and said controllable path of said fourth transistor disposed in a series circuit between said first supply terminal and said second supply terminal, said gate terminal of said fourth transistor connected to said second terminal of said fourth transistor;
   including a comparison unit having a first input connected to a circuit node between said controllable path of said third transistor and said controllable path of said fourth transistor and a second input receiving a comparison value, said comparison unit having an output and generating an output signal; and
   including a generator connected to said output of said comparison unit and outputting the second substrate potential for said second transistors, said generator generates the second substrate potential in dependence on the output signal from said comparison unit.

3. An integrated circuit, comprising:
   a first supply terminal;
   a second supply terminal;
   a differential amplifier, including:
      a first transistor of a first conductivity type and having a controllable path, a gate terminal, a substrate terminal for receiving a first substrate potential, and a first threshold potential;
      a second transistor of said first conductivity and having a controllable path, a gate terminal, a substrate terminal for receiving the first substrate potential, and the first threshold potential;
      a third transistor of a second conductivity type and having a controllable path, a gate terminal, a substrate terminal for receiving a second substrate potential, and a second threshold potential, said controllable path of said first transistor and said controllable path of said third transistor disposed in series between said first supply terminal and said second supply terminal;

a fourth transistor of said second conductivity type and having a controllable path, a gate terminal, a substrate terminal for receiving the second substrate potential, and the second threshold potential, said controllable path of said second transistor and said controllable path of said fourth transistor disposed in series between said first supply terminal and said second supply terminal;

a first signal input terminal connected to said gate terminal of said first transistor and to said gate terminal of said third transistor, said first signal input terminal further connected to a circuit node between said second transistor and said fourth transistor;

a second signal input terminal connected to said gate terminal of said second transistor and to said gate terminal of said fourth transistor, said second signal input terminal further connected to a circuit node between said first transistor and said third transistor;

a first control unit for controlling the first threshold potential of said first transistor and said second transistor, said first control unit having a first input for a required value of the first threshold potential, a second input for an actual value of the first threshold potential, and an output connected to said substrate terminal of each of said first transistor and said second transistor; and a second control unit for controlling the second threshold potential of said third transistor and said fourth transistor, said second control unit having a first input receiving a required value of the second threshold potential, a second input receiving an actual value of the second threshold potential, and an output connected to said substrate terminal of each of said third transistor and said fourth transistor, and the required value of the second threshold potential is proportional to the actual value of the first threshold potential.

* * * * *